Oct. 19, 1971 G. W. EDWARDS 3,613,232

MANUFACTURE OF CIRCUIT BOARDS

Filed July 1, 1969

INVENTOR

GEORGE W. EDWARDS

BY Emory L. Groff Jr. Atty

United States Patent Office 3,613,232

Patented Oct. 19, 1971

3,613,232

MANUFACTURE OF CIRCUIT BOARDS

George W. Edwards, 6–10 Harp St., Campsie, New South Wales, Australia

Filed July 1, 1969, Ser. No. 838,095
Claims priority, application Australia, July 12, 1968, 40,591/68
Int. Cl. B41m *3/08;* H05k *3/00*
U.S. Cl. 29—625 2 Claims

ABSTRACT OF THE DISCLOSURE

A circuit board, in which circuits are formed on a dielectric substrate member by a layer of conductive material bonded to one side of the substrate member, or by two layers of conductive material bonded one to each side of the substrate member, is manufactured by the following steps: forming holes in desired positions through the substrate member to form terminal points of a desired circuit layout; bonding the layer or layers of conductive material to the substrate member and over the holes; printing and etching the circuit; and drawing that part of the layer or layers over the holes into the holes in a mechanical operation to form a conductive wall or walls in each of the holes.

This invention has been devised to provide an improved method of manufacturing circuit boards having a plurality of holes formed therethrough in desired spaced relationship and having desired holes connected by conductive material.

The present invention provides in the finished circuit boards, terminal points of the circuit which are in the form of plug-in sockets providing adequate area for contact for the mounting pins of items to be mounted on the board and providing adequate frictional engagement of the mounting pins whereby the said pins need not be soldered in place. However, if the pins are to be soldered, the present invention also provides a greater surface area of the conductive layer of the circuit to which the pins can be soldered, then has been available in circuit boards available hitherto.

This latter feature is of considerable importance, as in known circuit boards which form part of equipment which is subjected to vibration, it is well known that the soldered joints between the mounting pins of items mounted on the board and the conductive layer(s) of the circuit, frequently fracture. This is usually due to the inadequate surface area of the conductive layer available for engagement by the solder.

Also, whilst it is known to use so called "squared" paper to lay out a circuit diagram, the use of such paper for this purpose has never been adopted hitherto in conjunction with precision tooling available, for the mass production of substrate members having the holes, hereinafter referred to as the terminal points of a desired circuit, formed therethrough economically and with the required degree of repetitive accuracy.

According to the present invention, a circuit board, in which circuits are formed on a dielectric substrate member by a layer of conductive material bonded to one side of the substrate member, or by two layers of conductive material bonded one to each side of the substrate member, is manufactured by the following steps:

Forming holes in desired positions through the substrate member to form terminal points of a desired circuit layout;

Bonding the layer or layers of conductive material to the substrate member and over the holes;

Printing and etching the circuit;

Drawing that part of the layer or layers over the holes into the holes in a mechanical operation to form a conductive wall or walls in each of the holes.

By way of example, the invention will be described with reference to the annexed drawings, wherein.

Figures 1, 2:
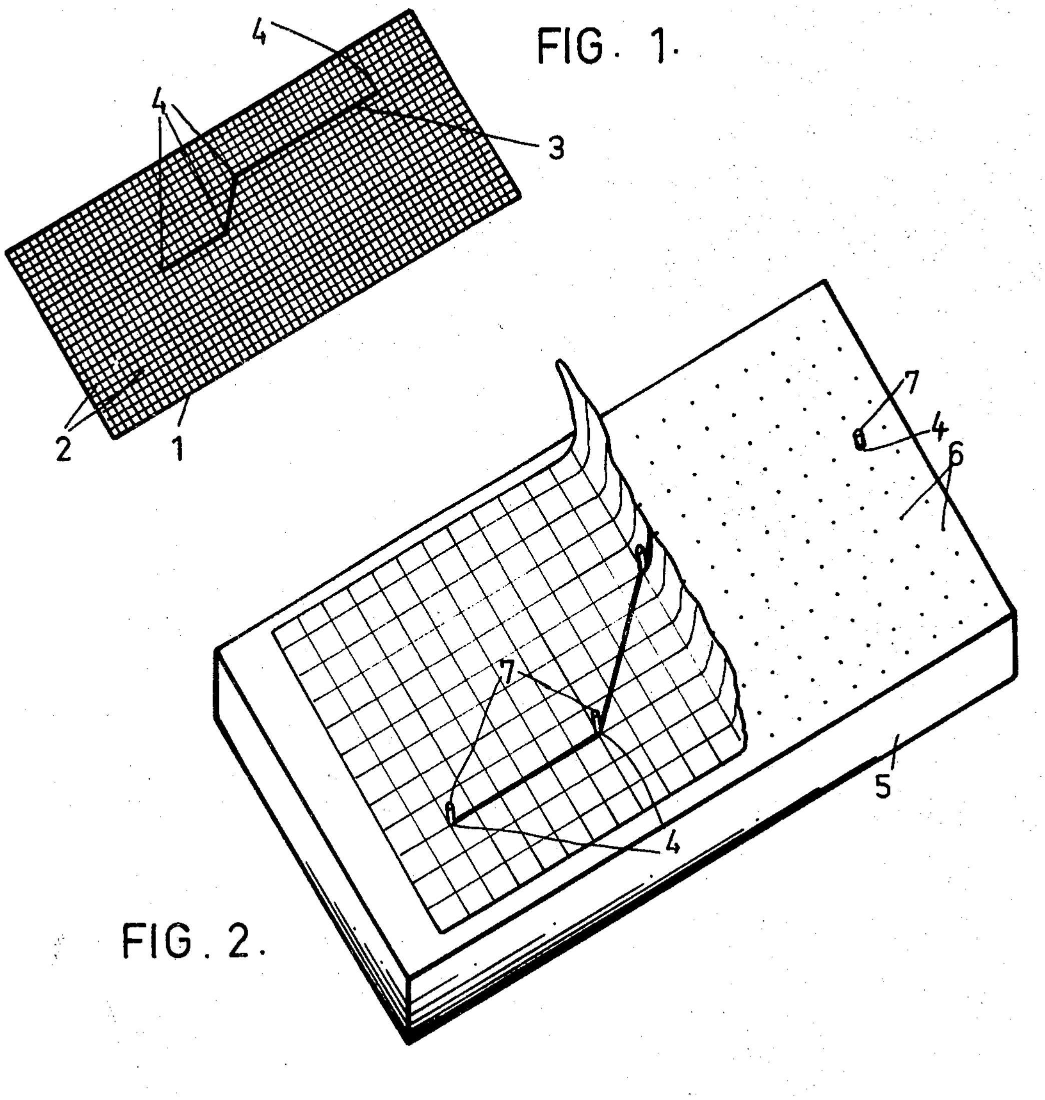
FIG. 1 illustrates a sheet of squared paper having a proposed circuit marked thereon.
FIG. 2 diagrammatically illustrates one die plate of a die set having the sheet of FIG. 1 mounted thereon.

Referring to FIG. 1, the sheet 1 of squared paper has the lines of intersection 2 thereof equally spaced apart on a predetermined modular pitch, e.g., one-tenth of an inch. The circuit 3 is laid out on the sheet 1 in such a way that the terminal points 4 thereof are each located at selected intersections of the lines 2.

Referring to FIG. 2, the die plate 5 has a plurality of holes 6 of the same diameter formed therein, the holes 6 being equally spaced apart on the same modular pitch as that of the intersections of the lines 2 of the sheet 1.

The sheet 1 is located on the die plate 5 with the terminal points 4 of the circuit 3 each located in register with a corresponding hole 6 in the die plate 5. Pins or punches 7 are inserted through the terminal points 4 of circuit 3 into the registering holes 6 and the sheet 1 is removed.

The die plate 5 then becomes one member of a die set, e.g., the lower plate thereof, in which substrate members 8 can be pressed, with holes 9 formed therethrough which correspond with the terminal points 4 of circuit 3.

If the die set is to be used in a moulding operation instead of a pressing operation as described, two thin sheets of metal are pierced with holes corresponding to the terminal point holes of the circuit. These sheets are adhered one to each die plate to cover all holes except the terminal holes, and hence when the substrate member is moulded, only the terminal holes are present therein.

Figure 3:
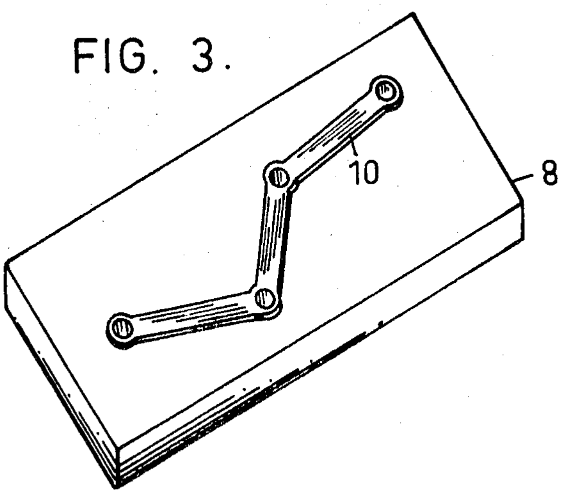
FIG. 3 illustrates the conductive material circuit mounted on the substrate.
Figure 4:
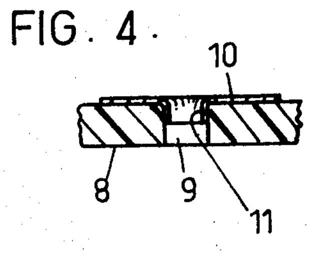
FIG. 4 illustrates how a socket of the circuit is positioned in a hole in the substrate.

A layer or layers of conductive material 10 is then bonded, by a suitable adhesive for example, to one or both sides of the substrate member 8 over the holes 9 and the conductive layer(s) is/are then etched in known manner to form the circuit 12 as shown in FIG. 3. The substrate member is then returned to the die set, and in the case of one layer 10, those parts of this layer over holes 9 are drawn down into the holes 9 by punches of lesser diameter than that of the holes 9, to form a conductive wall (socket) 11, in each of said holes 9. In the event that a conductive layer 10 is bonded to both sides of the substrate member 8, these layer parts over the holes 9 are drawn into the holes 9 from each side of the member 8. For this purpose, the punches are not only of lesser diameter than that of the holes 9, but they would only enter the holes 9 to about half the depth of said holes.

Circuit boards produced in the manner described have the following advantages:

(a) The holes 9 have the conductive material 10 drawn thereinto and thus provide a wall or walls giving greater contact area for the mounting pins of items to be mounted on the boards than exists in known circuit boards.

(b) Because of the drawing of material 10 into the holes 9, the holes 9 are particularly adaptable for use as the socket side 11 (i.e., the female side) of plug and socket connections and will positively and rigidly support plug members inserted therein. Also, if mounting pins are to be soldered in the sockets 11, the layer 10 drawn thereinto will provide adequate surface area for soldering, whereby soldered joints resist fracturing due to vibration.

(c) The accuracy of location of the holes 9 can be maintained to very fine tolerances by using mass produced drill blanks as punches.

(d) Multi-layer boards and double sided boards produced according to the invention need not be bonded together or be plated through the holes 9, as all boards in a "stack" are produced in the same die and as there is a uniform alignment of holes 9, a circuit 3 designed on all layers can be positively checked for hole position in track lay-out and then assembled by pushing a plug through the aligned holes in each board.

(e) Hollow plugs may be used in the holes 9, which would permit machine assembly of all plugs on one operation into the board and permit of riveting the plugs if desired, thus giving positive connection to all circuits in multi-layer boards. In any track where contact is not required, the conductor is removed during the etching process thus leaving that particular hole 9 insulated.

(f) Where long runs of one type of board are required, conventional dies may be provided for the piercing or moulding of the substrate and a support die may be provided for extruding the conductive material 10 into the holes 9. This technique will substantially increase production rate of the boards.

Also, it will be understood that modifications may be made in the production of the substrate members 8, such as by drilling the holes 9 therein, without departing from the spirit and scope of the invention. For "short runs" for example, the holes can be formed by drilling. A drill jig is provided which corresponds with the hole formation required for the circuit lay-out, and the holes are individually drilled.

What is claimed is:

1. Method of manufacturing a circuit board, in which a circuit is formed on a dielectric substrate member by a layer of conductive material bonded to one side thereof or by two layers of conductive material bonded to one side thereof or by two layers of conductive material bonded one to each side thereof, said method comprising the steps: laying out a circuit diagram on squared paper having lines of intersection which are equally spaced apart on a predetermined modular pitch, so that terminal points of the circuit are located at selected positions; forming in each of a pair of die plates, a plurality of holes of the same diameter, the holes being equally spaced apart on the same modular pitch as that of the intersections of the squared paper; mounting the die plates in a die set with the holes of one die plate in register with the holes in the other die plate; locating the squared paper on one die plate with the terminal points of the circuit each located in register with a corresponding hole in said die plate; inserting pins or punches through the terminal points of the circuit into registering holes in the die plate and removing the paper; molding or pressing a dielectric substrate member in the dies and removing said substrate member from the dies whereby it has the terminal holes of the circuit formed therethrough; bonding a layer or layers of conductive material to one or both sides of the substrate member, printing and etching the circuit; replacing the pins or punches in the die with punches of less diameter than that of said pins or punches; returning the substrate member to the dies and drawing the layer or layers of conductive material into the terminal holes in the substrate member.

2. The method of claim 1 wherein the modular pitch of the lines of intersection of the squared paper is one tenth of an inch.

References Cited

UNITED STATES PATENTS

| | | | |
|---|---|---|---|
| 2,772,501 | 12/1956 | Malcolm | 29—625 |
| 2,925,645 | 2/1960 | Bell | 29—625 |
| 2,974,284 | 3/1961 | Parker | 29—625 |
| 3,037,265 | 6/1962 | Kollmeier | 29—625 |
| 3,239,895 | 3/1966 | Stuckert | 29—625 |
| 3,346,950 | 10/1967 | Schick | 29—625 |
| 3,354,542 | 11/1967 | Mallia | 264—272 |
| 3,354,543 | 11/1967 | Lawrence | 29—625 |
| 3,361,251 | 1/1968 | Olsson | 29—625 |
| 3,389,461 | 6/1968 | Hardardt | 29—625 |
| 3,436,819 | 4/1969 | Lunine | 29—625 |

OTHER REFERENCES

IBM Technical Disclosure Bulletin, vol. 10, No. 11, p. 1665, April 1968, title, Low-Temperature, Air-Fired, Multilevel Microelectronic Structure by R. H. Schnitzel, J. B. Shapiro, R. G. Stevens.

JOHN F. CAMPBELL, Primary Examiner

D. P. ROONEY, Assistant Examiner

U.S. Cl. X.R.

29—628